United States Patent
Okuyama (10) Patent No.: US 11,551,728 B2
(45) Date of Patent: Jan. 10, 2023

(54) SEMICONDUCTOR STORAGE DEVICE

(71) Applicant: Kioxia Corporation, Tokyo (JP)

(72) Inventor: Kiyoshi Okuyama, Yokkaichi Mie (JP)

(73) Assignee: Kioxia Corporation, Tokyo (JP)

(*) Notice: Subject to any disclaimer, the term of this patent is extended or adjusted under 35 U.S.C. 154(b) by 7 days.

(21) Appl. No.: 17/205,657

(22) Filed: Mar. 18, 2021

(65) Prior Publication Data

US 2022/0076711 A1     Mar. 10, 2022

(30) Foreign Application Priority Data

Sep. 10, 2020  (JP) .............................. JP2020-151789

(51) Int. Cl.

| G11C 11/34 | (2006.01) |
|---|---|
| G11C 5/06 | (2006.01) |
| H01L 27/11556 | (2017.01) |
| H01L 23/528 | (2006.01) |
| G11C 5/02 | (2006.01) |
| H01L 27/11582 | (2017.01) |

(52) U.S. Cl.
CPC ............... *G11C 5/06* (2013.01); *G11C 5/025* (2013.01); *H01L 23/528* (2013.01); *H01L 27/11556* (2013.01); *H01L 27/11582* (2013.01)

(58) Field of Classification Search
CPC ......... G11C 5/06; G11C 5/025; H01L 23/528; H01L 27/11556; H01L 27/11582
USPC .................................................... 365/185.11
See application file for complete search history.

(56) References Cited

U.S. PATENT DOCUMENTS

| 8,895,393 | B2 * | 11/2014 | Sim .................. H01L 27/11565 |
|---|---|---|---|
| | | | 257/E21.21 |
| 9,343,507 | B2 * | 5/2016 | Takaki ................. H01L 27/249 |
| 9,524,773 | B2 * | 12/2016 | Lee ....................... G11C 7/1039 |
| 10,121,553 | B2 * | 11/2018 | Harari ................ G11C 11/5628 |
| 10,916,559 | B2 * | 2/2021 | Kito ................... H01L 27/11573 |
| 11,049,877 | B2 * | 6/2021 | Oike ................. H01L 27/11565 |
| 11,120,883 | B2 * | 9/2021 | Futatsuyama .......... G11C 16/08 |
| 11,270,980 | B2 * | 3/2022 | Tagami ............... H01L 27/1157 |
| 2016/0268304 | A1 | 9/2016 | Ikeda |
| 2022/0085045 | A1 * | 3/2022 | Nagashima ....... H01L 27/11565 |

FOREIGN PATENT DOCUMENTS

JP       A-2016-171243       9/2016

* cited by examiner

*Primary Examiner* — Viet Q Nguyen
(74) *Attorney, Agent, or Firm* — Foley & Lardner LLP (57) ABSTRACT

According to one embodiment, a semiconductor storage device includes a first memory cell, a second memory cell, a first transistor, a second transistor, and a third transistor. The first transistor includes a first portion electrically connected to a first circuit, a second portion electrically connected to the first memory cell, and a first gate electrode installed between the first portion and the second portion. The second transistor includes a third portion electrically connected to the first circuit, a fourth portion electrically connected to the second memory cell, and a first gate electrode installed between the third portion and the fourth portion. The third transistor includes the second portion, the fourth portion, a fifth portion electrically connected to a second circuit, and a second gate electrode installed between the second portion and the fifth portion and between the fourth portion and the fifth portion.

15 Claims, 9 Drawing Sheets

SEMICONDUCTOR STORAGE DEVICE

CROSS-REFERENCE TO RELATED APPLICATION

This application is based upon and claims the benefit of priority from Japanese Patent Application No. 2020-151789, filed Sep. 10, 2020; the entire contents of which are incorporated herein by reference.

FIELD

Embodiments described herein relate generally to a semiconductor storage device.

BACKGROUND

A semiconductor storage device including a stacked body in which a conductive layer and an insulating layer are alternately stacked on a substrate and a plurality of pillars that extend in the stacked body in a thickness direction of the substrate is known.

DETAILED DESCRIPTION

According to one embodiment, a semiconductor storage device includes a first memory cell, a second memory cell, a first transistor, a second transistor, and a third transistor. The second memory cell is different from the first memory cell. The first transistor includes a first portion electrically connected to a first circuit, a second portion electrically connected to the first memory cell, and a first gate electrode installed between the first portion and the second, portion. The second transistor includes a third portion electrically connected to the first circuit, a fourth portion electrically connected to the second memory cell, and a first gate electrode installed between the third portion and the fourth portion. The third transistor includes the second portion, the fourth portion, a fifth portion electrically connected to a second circuit, and a second gate electrode installed between the second portion and the fifth portion and between the fourth portion and the fifth portion.

Hereinafter, a semiconductor storage device according to an embodiment will be described with reference to the accompanying drawings. In the following description, constituents having the same or similar functions will be referred to by the same reference signs. Description thereof may not be repeated. "Parallel" in this specification includes "substantially parallel." "Perpendicular" in this specification includes "substantially perpendicular." "Connection" in this specification includes connection between two members with nothing interposed therebetween and connection between two members with another member interposed therebetween. A "ring shape" in this specification is not limited to a circular ring shape but includes a rectangular ring shape and a triangular ring shape. "XX is installed on YY" in this specification is not limited to a case in which XX is in contact with YY, but includes a case in which another member is interposed between XX and YY. "Readout" in this specification may be referred to as "reading" and "recording" may be referred to as "writing." "Write," "store." and "hold" in this specification are used with the same meaning. Accordingly, these tennis are interchangeable.

A +X direction, a −X direction, a +Y direction, a −Y direction, a +Z direction, and a −Z direction are first defined below. The +X direction, the −X direction, the ±Y direction, and the −Y direction are directions which are parallel to a surface 1a of a substrate 1 (see FIG. 3) which will be described later. The +X direction is a direction in which transistors Tr1a and Tr1b (FIG. 4) which will be described later are arranged. The −X direction is a direction opposite to the +X direction. The +X direction and the −X direction are simply referred to as an "X direction" when they are not distinguished from each other. The +Y direction and the −Y direction are directions crossing (for example, perpendicular to) the X direction. The +Y direction is a direction from a transistor Tr2 which will be described later to the transistors Tr1a and Tr1b. The −Y direction is a direction opposite to the +Y direction. The +Y direction and the −Y direction are simply referred to as a "Y direction" when they are not distinguished from each other. The +Z direction and the −Z direction are directions crossing (for example, perpendicular to) the X direction and the Y direction and are thickness directions of the substrate 1 (see FIG. 3). The +Z direction is a direction from the substrate 1 to a stacked body 10 which will be described later. The −Z direction is a direction opposite to the +Z direction. The +Z direction and the −Z direction are simply referred to as a "Z direction" when they are not distinguished from each other. In this specification, the "+Z direction" may be referred to as "up" and the "−Z direction" may be referred to as "down." These expressions are for convenience and do not define the gravitational direction. The +X direction is an example of a "first direction." The +Y direction is an example of a "second direction."

First Embodiment

[Configuration of Semiconductor Storage Device]

Figure 1:
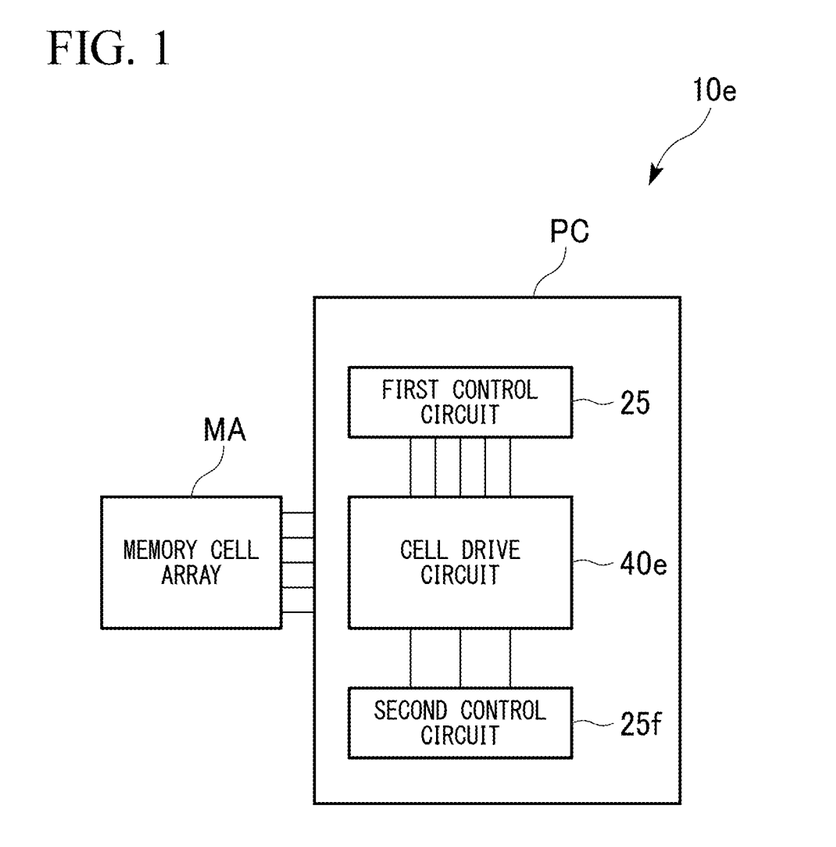
FIG. 1 is a diagram illustrating a configuration of a semiconductor storage device according to a first embodiment.

FIG. 1 is a block diagram illustrating a configuration of a semiconductor storage device 10e according to a first embodiment. The semiconductor storage device 10e includes a memory cell array MA and a peripheral circuit PC. The peripheral circuit PC includes a first control circuit 25, a second control circuit 25f, and a cell drive circuit 40e. When the same operation is performed on a plurality of memory cells MC (see FIG. 2) which are handled as a bundle in the memory cell array MA, the semiconductor storage device 10e applies the same voltage to the plurality of memory cells MC via the same contact CNT. The semiconductor storage device 10e is, for example, a storage device such as a NAND flash memory.

The memory cell array MA includes a plurality of memory cells MC that store data. The memory cell array MA performs writing of data, reading of data, and erasing of data on the basis of a voltage supplied from the cell drive circuit 40e via word lines WL and bit lines BL which will be described later (see FIG. 2). An example of the memory cell array MA is a memory cell array using three-dimensional NAND flash technology. The memory cell array MA is not limited to a memory cell array using three-dimensional NAND flash technology.

The first control circuit 25 is a circuit that selects memory cells MC which are used to write data to the memory cell array MA via the cell drive circuit 40e or selects memory cells MC which are used to read data from the memory cell array MA. In this embodiment, the first control circuit 25 is a sense amplifier which is connected to the bit lines BL. The first control circuit 25 is an example of a first circuit.

Figure 2:
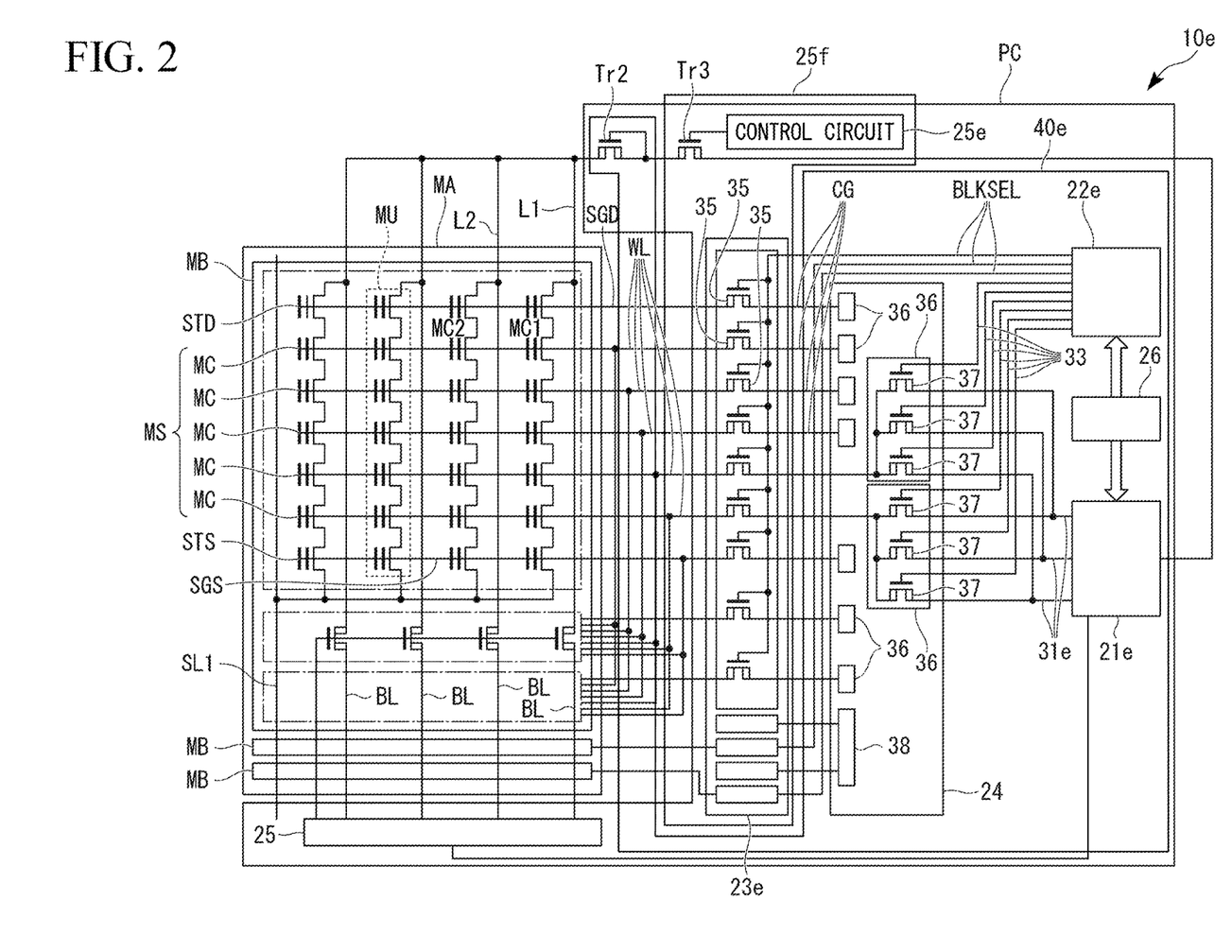
FIG. 2 is a diagram illustrating an equivalent circuit of the semiconductor storage device according to the first embodiment.

The second control circuit 25f is a circuit that selects memory cells MC which are used to erase data stored in the memory cell array MA via the cell drive circuit 40e. As illustrated in FIG. 2, the second control circuit 25f includes a transistor Tr3 that applies a voltage for erasing data to the memory cell array MA in units of blocks, a control circuit 25e that controls the transistor Tr3, and a block selection circuit 23e that transmits an operating voltage to the memory cell array MA in accordance with an output signal of an address decoder 22e which will be described later. The second control circuit 25f is an example of a second circuit. "Control the transistor Tr3" means that the transistor Tr3 is switched to an turn-on state or an turn-off state.

The cell drive circuit 40e applies a voltage for writing data to the memory cell array MA or a voltage for reading data from the memory cell array MA to the memory cell array MA on the basis of the control of the first control circuit 25. The cell drive circuit 40e applies a voltage for erasing data stored in the memory cell array MA to the memory cell array MA on the basis of the control of the second control circuit 25f. Erasing of data stored in the memory cell array MA is performed in units of blocks. That is, erasing of data stored in the memory cell array MA is performed by simultaneously applying the same voltage to all of a plurality of memory cells MC constituting the same block in the memory cell array MA in a range of an allowable error such as a delay time due to a interconnection (for example, a line such as an electrical wiring, a metal line, a wiring line, and the like) or a voltage drop due to a interconnection.

[Equivalent Circuit of Semiconductor Storage Device]

A circuit configuration of the semiconductor storage device 10e when the memory cell array MA is a memory cell array using three-dimensional NAND flash technology will be described below. FIG. 2 is an equivalent circuit diagram schematically illustrating the configuration of the semiconductor storage device 10e according to the first embodiment.

The memory cell array MA includes a plurality of memory blocks MB. Each of the plurality of memory blocks MB includes a plurality of memory units MU. One end of each of the plurality of memory units MU is connected to the cell drive circuit 40e via a corresponding bit line BL. The other end of each of the plurality of memory units MU is connected to the peripheral circuit PC which will be described later via a common source line SL1.

Each memory unit MU includes a drain selection transistor STD, a memory string MS, and a source selection transistor STS which are connected in series between the corresponding bit line BL and the corresponding source line SL1. In the following description, the drain selection transistor STD and the source selection transistor STS may be simply referred to as selection transistors (STD, STS).

The memory string MS includes a plurality of memory cells MC which are connected in series. Each memory cell MC in this embodiment is a field effect transistor including a charge storage film in a gate insulating film. A threshold voltage of the memory cell MC changes depending on an amount of charge in the charge storage film. Word lines WL are connected to gate electrodes of a plurality of memory cells MC corresponding to one memory string MS.

The selection transistors (STD, STS) are field effect transistors. Selection gate lines (SGD SGS) are connected to gate electrodes of the selection transistors (STD, STS). The selection gate line SGS is commonly connected to all the memory units MU in one memory block MB.

The cell drive circuit 40e includes an operating voltage generation circuit 21e, an address decoder 22e, a sequencer 26, and a voltage selection circuit 24. The operating voltage generation circuit 21e generates voltages which are used to write, read, and erase data. The address decoder 22e decodes address data. The sequencer 26 controls the operating voltage generation circuit 21e and the address decoder 22e. The voltage selection circuit 24 selects the voltages which are generated by the operating voltage generation circuit 21e. In the following description, the voltages which are used to write, read, and erase data and which are generated by the operating voltage generation circuit 21e may be referred to as an operating voltage.

The operating voltage generation circuit 21e includes a plurality of operating voltage output terminals 31e. The operating voltage generation circuit 21e includes, for example, a step-down circuit and a step-up circuit such as a charge pump circuit. For example, when a reading operation, a writing operation, and an erasing operation are performed on the memory cell array MA in accordance with control signals from the sequencer 26, the operating voltage generation circuit 21e generates a plurality of operating voltages which indicate various voltage values and are applied to the bit lines BL, the source lines SL1, the word lines WL, and the selection gate lines (SGD, SGS) and simultaneously outputs the operating voltages to the plurality of operating voltage output terminals 31e. The operating voltages output from the operating voltage output terminals 31e are appropriately adjusted in accordance with the control signals from the sequencer 26. The reading operation is an operation of the semiconductor storage device 10e performing a process of reading data from the memory cell array MA. The writing operation is an operation of the semiconductor storage device 10e performing a process of writing data to the memory cell array MA. The erasing operation is an operation of the semiconductor storage device 10e performing a process of erasing data stored in the memory cell array MA.

The operating voltage generation circuit 21e generates a reading voltage and a reading pass voltage as the operating voltages at the time of performing the reading operation. The reading voltage is a voltage which is used to discriminate data stored in a selected memory cell MC. When the reading voltage is applied to a word line WL, some of the plurality of memory cells MC connected to the word line WL are turned on and the other memory cells MC are turned off. The reading pass voltage is a voltage for turning on a memory cell MC and is higher than the reading voltage. When the reading pass voltage is applied to a word line WL, all of the plurality of memory cells MC connected to the word line WL are turned on.

The operating voltage generation circuit 21e generates a writing pass voltage and a program voltage as the operating voltages at the time of performing the writing operation. The writing pass voltage is a voltage for turning on a memory cell MC and is higher than or equal to the reading voltage. When the writing pass voltage is applied to a word line WL, all of a plurality of memory cells MC connected to the word line WL are turned on. The program voltage is a voltage for storing charge in the charge storage film of a memory cell MC and is higher than the writing pass voltage. When the writing pass voltage is applied to a word line WL, electrons are stored in the charge storage film of some of a plurality of memory cells MC.

The address decoder 22e includes a plurality of block selection lines BLKSEL and a plurality of voltage selection lines 33. The address decoder 22e sequentially refers to address data of an address register in accordance with a control signal from the sequencer 26, decodes the address data, and turns on predetermined block selection transistors 35 and predetermined voltage selection transistors 37 corresponding to the address data. The address decoder 22e turns off the other block selection transistors 35 and the other voltage selection transistors 37. For example, the address decoder 22e sets voltages of the predetermined block selection lines BLKSEL and the predetermined voltage selection lines 33 to "H" level (high level) and sets voltages of the others to "L" level (low level). When P-channel type transistors are used instead of N-channel type transistors, the reverse voltages are applied to the lines.

In the illustrated example, one block selection line BLKSEL for each memory block MB is installed in the address decoder 22e. However, this configuration can be appropriately modified. For example, one block selection line BLKSEL may be included for every two or more memory blocks MB.

The block selection circuit 23e includes a plurality of block selection portions 34 corresponding to the memory blocks MB. The plurality of block selection portions 34 include a plurality of block selection transistors 35 corresponding to the word lines WL and the selection gate lines (SGD, SGS). Each block selection transistor 35 is, for example, a field effect transistor with a high withstand voltage. The drain electrode of the block selection transistor 35 is electrically connected to the corresponding word line WL or the corresponding selection gate line (SGD, SOS). The source electrode thereof is electrically connected to the operating voltage output terminals 31e via a interconnection CG and the voltage selection circuit 24. The gate electrode thereof is commonly connected to the corresponding block selection line BLKSEL.

In the illustrated example, in the block selection circuit 23e, one block selection transistor 35 is installed for each word line WL and one block selection transistor 35 is installed for each selection gate line (SGD, SOS). However, this configuration can be appropriately modified. For example, two block selection transistors 35 may be installed for each selection gate line (SGD, SGS).

The voltage selection circuit 24 includes a plurality of first voltage selection portions 36 corresponding to the word lines WL and the selection gate lines (SOD. SGS). Each of the plurality of first voltage selection portions 36 includes a plurality of voltage selection transistors 37. Each voltage selection transistor 37 is, for example, a field effect transistor with a high withstand voltage. The drain terminal of each voltage selection transistor 37 is electrically connected to the corresponding word line WL or the corresponding selection gate line (SOD, SGS) via a interconnection CO and the block selection circuit 23e. The source terminal thereof is electrically connected to the corresponding operating voltage output terminals 31e. The gate electrode thereof is connected to the corresponding voltage selection line 33.

The first control circuit 25 is connected to a plurality of bit lines BL. The first control circuit 25 includes, for example, a plurality of sense amplifier units corresponding to the bit lines BL. Each sense amplifier unit includes a clamp transistor that charges the corresponding bit line BL on the basis of a voltage generated by the operating voltage generation circuit 21e, a sense circuit that senses a voltage or a current of the bit line BL, a plurality of latches that hold an output signal of the sense circuit, data being written, a verification pass flag, and the like, and a logic circuit. The logic circuit identifies data held in memory cells MC with reference to data of lower pages held in the latches, for example, at the time of performing a reading operation. The logic circuit controls the voltage of the bit line BL with reference to the data of lower pages held in the latches, for example, at, the time of performing a writing operation.

The sequencer 26 outputs control signals to the operating voltage generation circuit 21e, the address decoder 22e, and the first control circuit 25 on the basis of an input command and a state of the semiconductor storage device 10e. For example, the sequencer 26 sequentially decodes command data in command registers with reference to the command data in accordance with a clock signal, and outputs the decoded command data to the operating voltage generation circuit 21e, the address decoder 22e, and the first control circuit 25.

[Structure of Semiconductor Storage Device]

Figure 3:
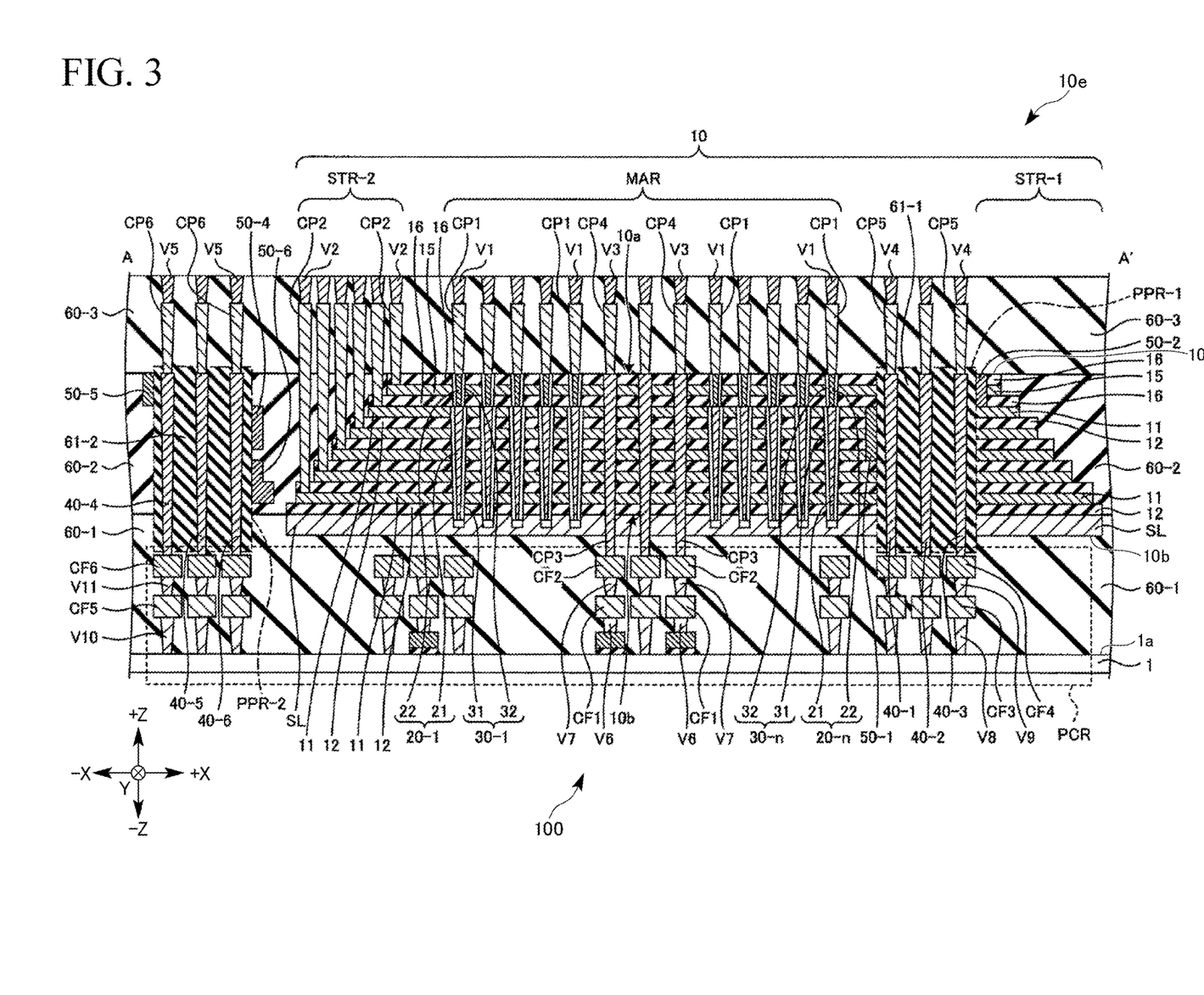
FIG. 3 is a sectional view illustrating a structure of the semiconductor storage device according to the first embodiment.

The configuration of the semiconductor storage device 10e according to this embodiment will be described below with reference to FIG. 3. FIG. 3 is a sectional view illustrating the configuration of the semiconductor storage device 10e. The semiconductor storage device 10e includes a substrate 1, a stacked body 10, a plurality of pillars 20-1 to 20-n, a plurality of insulating films 30-1 to 30-n, and a plurality of penetration plugs 40-1 to 40-6. The semiconductor storage device 10e may include another stacked body at a location adjacent to the stacked body 10 on the +X side.

The stacked body 10 is arranged above (on the +Z side of) the substrate 1. The plurality of pillars 20-1 to 20-n penetrate the stacked body 10 in a stacking direction (the Z direction) of the stacked body 10. The plurality of insulating films 30-1 to 30-n correspond to the plurality of pillars 20-1 to 20-n. Each insulating film 30 surrounds the corresponding pillar 20 in a section along the X direction and the Y direction. Each insulating film 30 covers, for example, a side surface of the corresponding pillar 20. The plurality of insulating films 30-1 to 30-n extend in the stacking direction of the stacked body 10 (the Z direction). Insulators 60-1 to 60-3 are arranged to surround the stacked body 10. The insulator 60-3 is arranged at a location on the ±Z side of an end 10a in the +Z direction of the stacked body 10. The insulator 60-2 is arranged at a location between the end 10a in the +Z direction and an end 10b in the −Z direction of the stacked body 10. The insulator 60-1 is arranged at a location on the −Z side of the end 10b in the −Z direction of the stacked body 10.

Each pillar 20 includes a pillar 21 and a pillar 22, and the pillar 21 and the pillar 22 are sequentially stacked in the Z direction and can be electrically connected to each other. The pillar 21 is formed of a material including semiconductor (for example, poly-silicon) as a major component and can work as a channel region for a memory cell MC. The pillar 22 is formed of a material including semiconductor (for example, poly-silicon) as a major component and can work as a channel region for a selection transistor (STD, STS). Each of the pillar 21 and the pillar 22 are formed in, for example, a substantially cylindrical shape extending in the Z direction, and a core insulating film can be arranged therein. The diameter of the pillar 22 can be less than the diameter of the pillar 21.

Each insulating film 30 includes an insulating film 31 and an insulating film 32, and the insulating film 31 and the insulating film 32 are sequentially stacked in the Z direction. The insulating film 31 covers the side surface of the pillar 21, is formed as a multi-layered film (for example, a silicon oxide film/silicon nitride film/silicon oxide film), and can work as an insulating film for a memory cell MC. The insulating film 32 covers the side surface of the pillar 22, is formed as a single-layered film (for example, a silicon oxide film), and can work as an insulating film for a selection transistor (STD, STS). The insulating film 32 may be formed as a multi-layered film (for example, a silicon oxide film/silicon nitride film/silicon oxide film).

The stacked body 10 includes a memory cell array region MAR and stepped regions (stair-shape regions) STR-1 and STR-2. The memory cell array region MAR represents a region in which the memory cell array MA is formed. The stepped region STR-1 is arranged on the +X side of the memory cell array region MAR, and the stepped region STR-2 is arranged on the −X side of the memory cell array region MAR.

Plug positioning regions PPR-1 and PPR-2 are located around the memory cell array region MAR. The plug positioning region PPR-1 is arranged at a location on the +X side of the memory cell array region MAR of the stacked body 10 and on the −X side of the stepped region STR-1, that is, between the memory cell array region MAR and the stepped region STR-1 of the stacked body 10. Penetration plugs 40-1 to 40-3 are arranged, in the plug positioning region PPR-1. The plug positioning region PPR-2 is arranged on the −X side of the memory cell array region MAR and the stepped region STR-2 of the stacked body 10 and is arranged adjacent to the stepped region STR-2. Penetration plugs 40-4 to 40-6 are arranged in the plug positioning region PPR-2.

The stacked body 10 is configured so that a conductive layer 11 and an insulating layer 12 are alternately and repeatedly stacked in the stacking direction (the Z direction) in the memory cell array region MAR and a charge storage film and a tunnel insulating film are present in a part of the pillar 21 crossing the conductive layer 11 to work as a memory cell MC. Accordingly, a plurality of memory cells MC are three-dimensionally arranged. The part of the conductive layer 11 crossing the pillar 21 can work as a control gate of a memory cell MC. The other part of the conductive layer 11 can work as a word line WL for transmitting a signal to the control gate. A part in which at least one layer including the lowest conductive layer 11 of the plurality of conductive layers 11 and the pillar 21 cross each other may be configured to work as a source-side selection transistor STS.

In the stacked body 10, additionally, at least one layer of a conductive film 15 and an insulating layer 16 are repeatedly arranged in the stacking direction (the Z direction) and a part in which the conductive film 15 and the pillar 22 cross each other is configured to work as a drain-side selection transistor STD, whereby a selective access property to the memory cell MC can be secured. The part of the conductive film 15 crossing the pillar 22 can work as a selection gate of the selection transistor STD, and the other part of the conductive film 15 can work as a selection control line for transmitting a signal to the selection gate.

In the stacked body 10, a stepped structure (a stair-shape structure) is arranged in the stepped region STR-2. The stepped structure is a structure in which the plurality of conductive layers 11 and the conductive film 15 are drawn in a stepped shape (a stair shape) from the memory cell array region MAR to the outside thereof. In the stacked body 10, a plurality of contact plugs CP2 extending in a depth direction with different depths from a predetermined interconnection layer are connected to the plurality of conductive layers 11 and the conductive film 15 drawn in the stepped shape, in the stepped region STR-2. Each contact plug CP2 is connected to an upper interconnection (not illustrated) via a plug V2.

In the memory cell array region MAR, the memory cells MC can be accessed via a interconnection structure drawn in the +Z direction from the plurality of conductive layers 11 and the conductive film 15 in the stepped shape and interconnections (that is, the contact plugs CP1, the plugs V1, and upper interconnections (not illustrated) drawn in the +Z direction from the pillars 20. On the other hand, the first control circuit 25 and the second control circuit 25*f* that control the memory cells MC are arranged in a peripheral circuit region PCR below (on the −Z side of) the stacked body 10. Accordingly, the penetration plugs 40-1 to 40-6 and the penetration contacts CP3 that extend from the same height location as the upper end 10a of the stacked body 10 or a location higher than the upper end 10a to a location lower than the lower end 10b of the stacked body 10 are installed.

For example, each of the penetration plugs 40-1 to 40-3 extends from the same location in the Z direction as the end 10a in the +Z direction of the stacked body 10 or a location on the +Z side of the end 10a in the +Z direction to a location on the −Z side of the end 10b in the −Z direction and penetrates an insulating film 61-1 and the stacked body 10 (an example in which the penetration plugs 40-1 to 40-3 extend from the same location in the Z direction as the end 10a in the +Z direction of the stacked body 10 to a location on the −Z side of the end 10b in the −Z direction is illustrated in FIG. 3). The insulating film 61-1 is an insulating film that is selectively buried in the plug positioning region PPR-1 separately from the insulators 60-1 to 60-3. Each of the penetration plugs 40-1 to 40-3 penetrates a conductive layer SL below the stacked body 10 and extends to a conductive film CF4 in the peripheral circuit region PCR. The conductive layer SL works as a source line in a three-dimensional memory and is connected to the lower end of the pillars 20 penetrating the stacked body 10 in the Z direction. The insulating film 61-1 which is arranged to surround the penetration plugs 40-1 to 40-3 in a section along the X direction and the Y direction insulates between each of the penetration plugs 40-1 to 40-3 and the stacked body 10 and between each of the penetration plugs 40-1 to 40-3 and the conductive layer SL from each other. As illustrated in FIG. 3, transmission and reception of signals between an upper interconnection (not illustrated) and the first control circuit 25 and between an upper interconnection and the second control circuit 25f can be performed via a plug V4, a contact CP5, the penetration plug 40-1 (or 40-2 or 40-3), the conductive film CF4, a plug V9, the conductive film CF3, and a plug V8. The number of plugs or contacts which are arranged between the upper interconnection (not illustrated) and the first control circuit 25 and between the upper interconnection and the second control circuit 25f is not limited thereto, and, for example, a plug in which the contact CP5 and the penetration plug 40-1 (or 40-2 or 40-3) are handled as a bundle and which extends from a location on the +Z side of the end 10a in the +Z direction of the stacked body 10 to a location on the −Z side of the end 10b in the −Z direction may be installed.

Each of the penetration plugs 40-4 to 40-6 extends from the same location in the Z direction as the end 10a in the +Z direction of the stacked body 10 or a location on the +Z side of the end 10a in the +Z direction to a location on the −Z side of the end 10b in the −Z direction and penetrates an insulating film 61-2 (an example in which the penetration plugs 40-4 to 40-6 extend from the same location in the Z direction as the end 10a in the +Z direction of the stacked body 10 to a location on the −Z side of the end 10b in the −Z direction is illustrated in FIG. 3). The insulating film 61-2 is an insulating film that is selectively buried in the plug positioning region PPR-2 separately from the insulators 60-1 to 60-3. Each of the penetration plugs 40-4 to 40-6 extends to a conductive film CF6 in the peripheral circuit region PCR. Each of the penetration plugs 40-4 to 40-6 are insulated from each other by the insulating film 61-2 which is arranged to surround the penetration plugs 40-4 to 40-6 in the XY sectional view. As illustrated in FIG. 3, transmission and reception of signals between an upper interconnection (not illustrated) and the first control circuit 25 and between an upper interconnection and the second control circuit 25f can be performed via a plug V5, a contact CP6, the penetration plug 40-4 (or 40-5 or 40-6), the conductive film CF6, a plug V11, the conductive film CF5, and a plug V10. The number of plugs or contacts which are arranged between the upper interconnection (not illustrated) and the first control circuit 25 and between the upper interconnection and the second control circuit 25f is not limited thereto similarly to the plug positioning region PPR-1.

The penetration contact CP3 extends from the same location in the Z direction as the end 10a in the +Z direction of the stacked body 10 or a location on the +Z side of the end 10a in the +Z direction to a location on the −Z side of the end 10b in the −Z direction and penetrates the stacked body 10 (an example in which the penetration contact CP3 extends from the same location in the Z direction as the end 10a in the +Z direction of the stacked body 10 to a location on the −Z side of the end lab in the −Z direction is illustrated in FIG. 3). The penetration contact CP3 penetrates the conductive layer SL below the stacked body 10 and extends to a conductive film CF2 in the peripheral circuit region PCR. An insulating film (not illustrated) which is arranged to surround the penetration contact CP3 in the XY sectional view insulates between the penetration contact CP3 and the stacked body 10 and between the penetration contact CP3 and the conductive layer SL from each other. As illustrated in FIG. 3, transmission and reception of signals between an upper interconnection (not illustrated) and the first control circuit 25 and between an upper interconnection and the second control circuit 25f can be performed via a plug V3, a contact CP4, the penetration contact CP3, the conductive film CF2, a plug V7, the conductive film CF1, and a plug V6. The number of plugs or contacts which are arranged between the upper interconnection (not illustrated) and the first control circuit 25 and between the upper interconnection and the second control circuit 25f is not limited thereto, similarly to the plug positioning regions PPR-1 and PPR-2. The same penetration contact CP3' (not illustrated) as the penetration contact CP3 may be arranged in the stepped region STR-1. In this case, the penetration contact CP3' extends from a location on the +Z side of the end 10a in the +Z direction of the stacked body 10 to a location on the −Z side of the end 10b in the −Z direction and penetrates the stepped structure of the stepped region STR-1. The penetration contact CP3' penetrates the conductive layer SL below the stacked body 10 and extends to a conductive film (not illustrated) in the peripheral circuit region PCR.

Transmission and reception of a signal between an upper interconnection (not illustrated) and the conductive layer 11 are performed via a plug V2 and a contact CP2, and transmission and reception of a signal between an upper interconnection (not illustrated) serving as a bit line BL in a three-dimensional memory and the pillars 20 are performed via a plug V1 and a contact CP1. The pillar 20 in the XY sectional view is surrounded by a substantially cylindrical insulating film 30 having charge storage capability (capability to store charge). The pillar 20 may have a structure in which a core insulating film is arranged in a semiconductor member.

[Batch Process]

Figure 4:
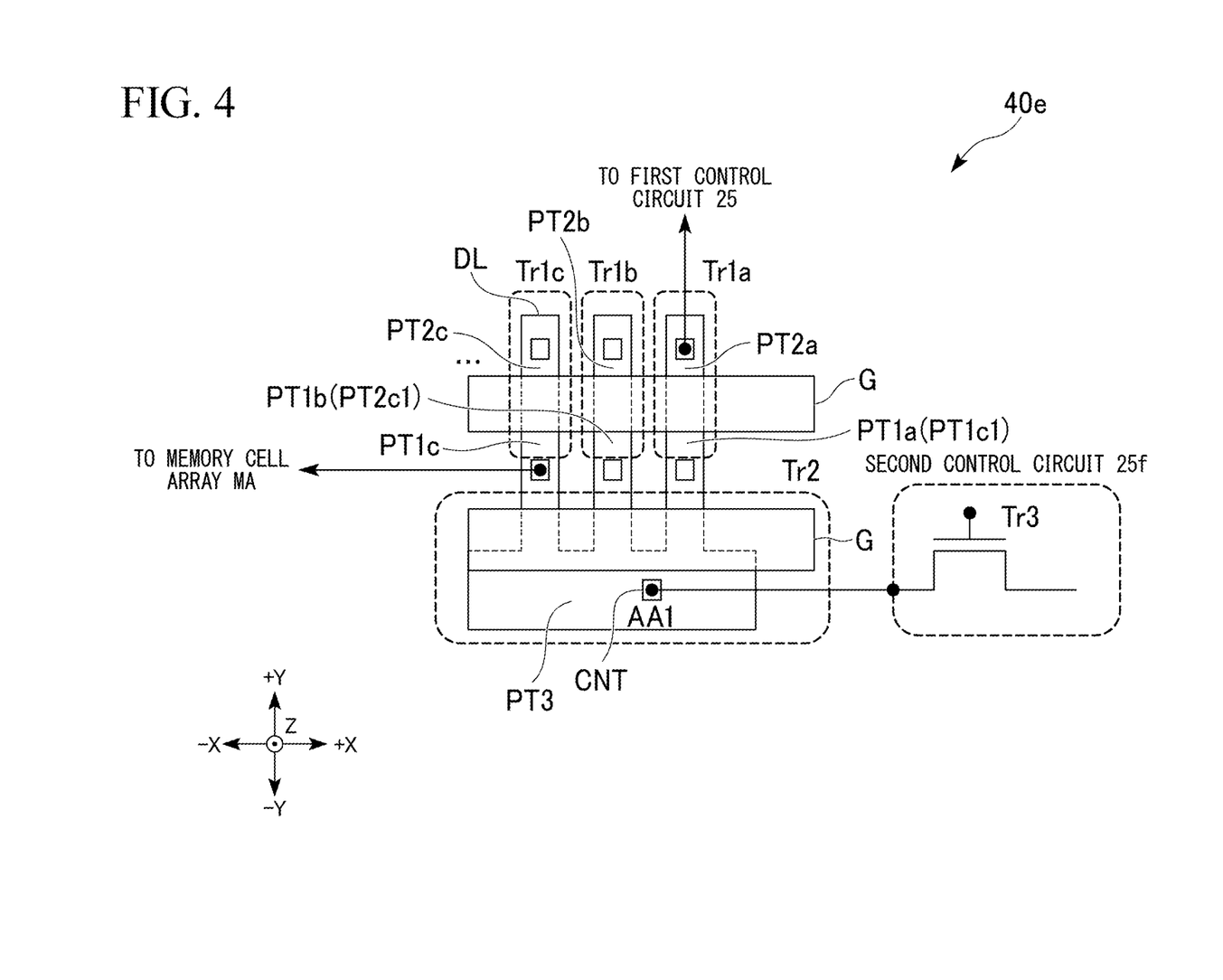
FIG. 4 is a diagram illustrating a batch process according to the first embodiment.

The cell drive circuit 40e when a batch process is performed on a plurality of memory cells MC in the memory cell array MA will be described below. FIG. 4 is a diagram illustrating a part of the cell drive circuit 40e. A part of the cell drive circuit 40e includes a transistor Tr1a and a transistor Tr2a. The transistor Tr1a and the transistor Tr2a are formed in an active region into which impurities have been implanted.

The transistor Tr1a is a transistor that is connected to the first control circuit 25. The transistor Tr1a is an example of a first transistor. The transistor Tr1a includes a first portion PT2a and a second portion PT1a. The second portion PT1a of the transistor Tr1a is a portion that is located on the −Y side of the gate electrode G of the transistor Tr1a. The first portion PT2a of the transistor Tr1a is a portion that is located on the +Y side of the gate electrode G of the transistor Tr1a. The second portion PT1a of the transistor Tr1a is connected to a first memory cell MC1 in the memory cell array MA via a first line L1. The first line L1 is one of a plurality of bit lines BL. When the first memory cell MC1 is indicated by a memory cell referred to by reference sign MC1 in FIG. 2, a portion including the selection transistor STD between the transistor Tr2 and the first memory cell MC1 corresponds to the first line L1. When the selection transistor STD connected to the first memory cell MC1 is a transistor that is located in a part in which the conductive film 15 at an end in the +X direction in the memory cell array region MAR and the pillar 22 cross each other in FIG. 3, the first line L1 includes the penetration plug (one of 40-1 to 40-6, for example, 40-1) connected to the transistor Tr2, the penetration contact CP3 installed in the penetration plug, a interconnection structure drawn in the +Z direction from the plurality of conductive layers 11 and the conductive film 15 in a stepped shape to which the contact CP3 is connected, the selection transistor STD located in a part in which the conductive film 15 and the pillar 22 cross each other, and a conductor portion (not illustrated) from the selection transistor STD to the first memory cell MC1. The pillar 22 is an example of a first pillar. The second portion PT1a of the transistor Tr1a is a source. The first portion PT2a of the transistor Tr1a is a drain. Each of the second portion PT1a and the first portion PT2a is one of active regions.

The transistor Tr1b is a transistor that is connected to the first control circuit 25. The transistor Tr1b is an example of a second transistor. The transistor Tr1b includes a third portion PT2b and a fourth portion PT1b. The fourth portion PT1b of the transistor Tr1b is a portion that is located on the −Y side of the gate electrode G of the transistor Tr1b. The third portion PT2b of the transistor Tr1b is a portion that is located on the +Y side of the gate electrode G of the transistor Tr1b. The fourth portion PT1b of the transistor Tr1b is connected to a second memory cell MC2 in the memory cell array MA via a second line L2. The second line L2 is one of a plurality of bit lines BL. When the second memory cell MC2 is indicated by a memory cell referred to by reference sign MC2 in FIG. 2, a portion including the selection transistor STD between the transistor Tr2 and the second memory cell MC2 corresponds to the second line L2. When the selection transistor STD connected to the second memory cell MC2 is a pillar 22 (that is, a pillar 22 other than the pillar 22 corresponding to the first line L1 and an example of a second pillar) that is located on the −X side of the transistor located in a part in which the conductive film 15 at an end in the +X direction in the memory cell array region MAR and the pillar 22 cross each other in FIG. 3, the second line L2 includes a penetration plug (one of 40-1 to 40-6 other than the first line L1, for example, 40-2) connected to the transistor Tr2, the penetration contact CP3 installed in the penetration plug, a interconnection structure drawn in the +Z direction from the plurality of conductive layers 11 and the conductive film 15 in a stepped shape to which the contact CP3 is connected, the selection transistor STD located in a part in which the conductive film 15 and the pillar 22 cross each other, and a conductor portion (not illustrated) from the selection transistor STD to the first memory cell MC1. The fourth portion PT1b of the transistor Tr1b is a source. The third portion PT2b of the transistor Tr1b is a drain. Each of the fourth portion PT1b and the third portion PT2b is one of active regions.

The first control circuit 25 is individually connected to the first portion PT2a of the transistor Tr1a and the third portion PT2b of the transistor Tr1b. The expression "individually connected" means that the first control circuit 25 includes a circuit corresponding to the first portion PT2a in one-to-one correspondence and a circuit corresponding to the third portion PT2b in one-to-one correspondence and the circuits are connected to the first portion PT2a and the third portion PT2b in one-to-one correspondence. The transistor Tr2 is an example of a third transistor. The transistor Tr2 includes a second portion PT1c1, a fourth portion PT2c1, and a fifth portion PT3. The second portion PT1c1 is a source of the transistor Tr2. The fourth portion PT2c1 is a source of the transistor Tr2. The fifth portion PT3 is a drain of the transistor Tr2. The second portion PT1c1 of the transistor Tr2 shares the second portion PT1a of the transistor Tr1a with the transistor Tr1a. Here, "sharing" means that the second portion PT1c1 and the second portion PT1a are formed of the same conductor without using a contact. The fourth portion PT2c1 of the transistor Tr2 shares the fourth portion PT1b of the transistor Tr1b with the transistor Tr1b. The fifth portion PT3 of the transistor Tr2 is able to be commonly connected to the third portion PT1c1 of the transistor Tr2 and the fourth portion PT2c1 of the transistor Tr2. Here, "being able to be commonly connected" means that the fifth portion PT3 is electrically connected to the third portion PT1c1, and the fourth portion PT2c1 when a contact is formed in the fifth portion PT3, a voltage is applied to the gate electrode G of the transistor Tr2, and the transistor Tr2 is turned on. A transistor Tr3 is connected to the fifth portion PT3 of the transistor Tr2.

Figure 5:
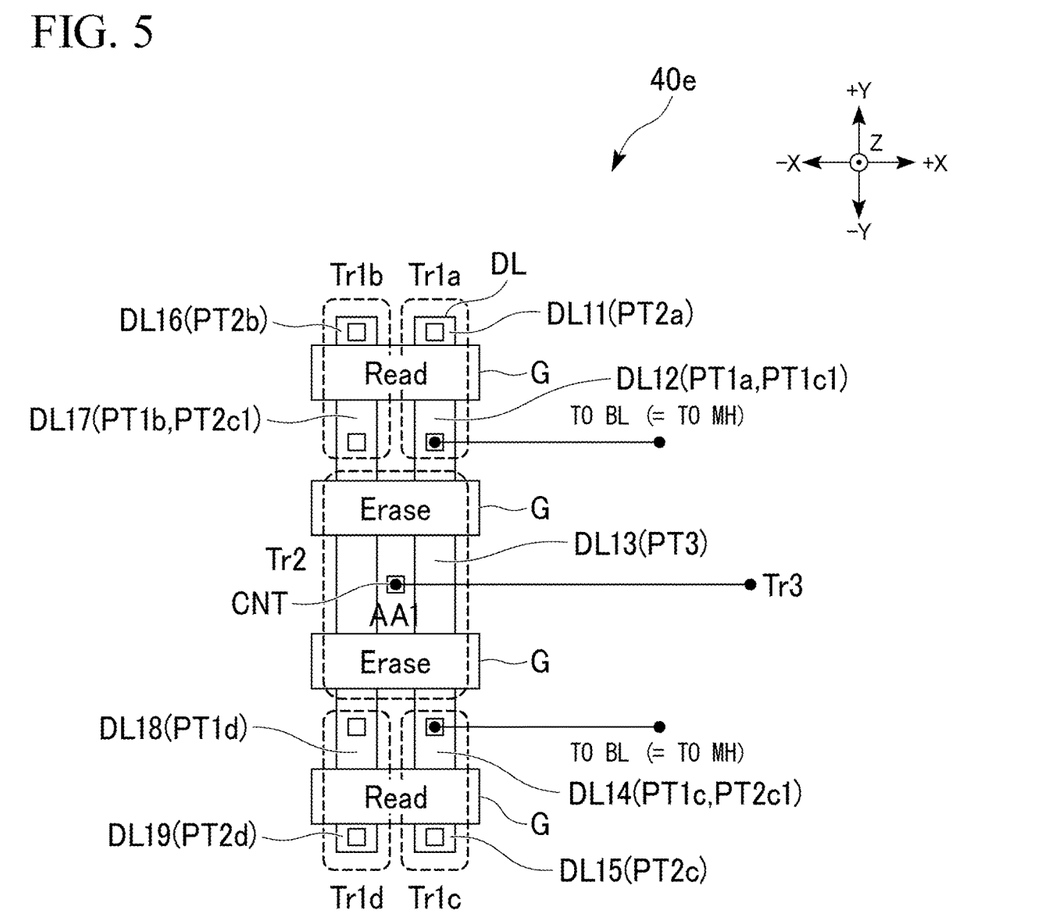
FIG. 5 is a diagram illustrating a layout of the semiconductor storage device according to the first embodiment.

The transistor Tr2 is a transistor that drives a plurality of memory cells MC on which a common operation is simultaneously performed in the memory cell array MA. An example of the common operation which is simultaneously performed on a plurality of memory cells MC in the memory cell array MA is an operation of erasing data in the unit of blocks when the semiconductor storage device 10e is a flash memory. FIG. 5 is a diagram illustrating a layout of the cell drive circuit 40e. When the common operation which is simultaneously performed on a plurality of memory cells MC in the memory cell array MA is the operation of erasing data, the cell drive circuit 40e is formed, for example, as illustrated in FIG. 5. That is, four gate electrodes including first to fourth gate electrodes G extending in the X direction are formed on the +Z side of a diffusion layer DL in which transistors are formed. Each of the first gate electrode G and the fourth gate electrode G is a gate electrode for reading data. A diffusion layer DL1 includes a first diffusion layer DL11, a second diffusion layer DL12, a third diffusion layer DL13, a fourth diffusion layer DL14, a fifth diffusion layer DL15, a sixth diffusion layer DL16, a seventh diffusion layer DL17, an eighth diffusion layer DL18, and a ninth diffusion layer DL19. In a bird's-eye view of the XY plane from the +Z direction, the first gate electrode G, the second diffusion layer DL12, the second gate electrode G, the third diffusion layer DL13, the third gate electrode G, the fourth diffusion layer DL14, the fourth gate electrode G, and the fifth diffusion layer DL15 are sequentially arranged toward the −Y side of the first diffusion layer DL11. The sixth diffusion layer DL16 is arranged on the +Y side of the first gate electrode G and on the −X side of the first diffusion layer DL11. The first gate electrode G, the seventh diffusion layer DL17, the second gate electrode G, the third diffusion layer DL13, the third gate electrode G, the eighth diffusion layer DL18, the fourth gate electrode G, and the ninth diffusion layer DL19 are sequentially arranged toward the −Y side of the sixth diffusion layer DL16.

The transistor Tr1a is constituted by the first diffusion layer DL11, the second diffusion layer DL12, and the first gate electrode G. The transistor Tr1a is an example of the first transistor. The first diffusion layer DL11 is the first portion PT2a of the transistor Tr1a. The second diffusion layer DL12 is the second portion PT1a of the transistor Tr1a. The second portion PT1a is the source of the transistor Tr1a. The first portion PT2a is the drain of the transistor Tr1a.

The transistor Tr2 is constituted by the second diffusion layer DL12, the fourth diffusion layer DL14, the seventh diffusion layer DL17, the eighth diffusion layer DL18, the second gate electrode G, and the third gate electrode G. The transistor Tr2 is an example of the third transistor. The second diffusion layer DL12 is the second portion PT1c1 of the transistor Tr2. The third diffusion layer DL13 is the fifth portion PT3 of the transistor Tr2. The second portion PT1c1, the fourth diffusion layer DL14, the seventh diffusion layer DL17, and the eighth diffusion layer DL18 are the source of the transistor Tr2. The fifth portion PT3 is the drain of the transistor Tr2. A contact CNT for connection to the transistor Tr3 is formed in the fifth portion PT3. The fifth portion PT3 in which the contact CNT for connection to the transistor Tr3 is formed is an active region AA1.

A transistor Tr1*b* is constituted by the sixth diffusion layer DL16, the seventh diffusion layer DL17, and the first gate electrode G. The transistor Tr1*b* is an example of the second transistor. The sixth diffusion layer DL16 is the third portion PT2*b* of the transistor Tr1*b*. The seventh diffusion layer DL17 is the fourth portion PT1*b* of the transistor Tr1*b*. The third portion PT1*b* is the source of the transistor Tr1*b*. The fourth portion PT2*b* is the drain of the transistor Tr1*b*.

A transistor Tr1*c* is constituted by the fourth diffusion layer DL14, the fifth diffusion layer DL15, and the fourth gate electrode G. The fifth diffusion layer DL15 is a sixth portion PT2*c* of the transistor Tr1*c*. The fourth diffusion layer DL14 is a seventh portion PT1*c* of the transistor Tr1*c*. The seventh portion PT1*c* is the source of the transistor Tr1*c*. The sixth portion PT2*c* is the drain of the transistor Tr1*c*.

A transistor Tr1*d* is constituted by the eighth diffusion layer DL18, the ninth diffusion layer DL19, and the fourth gate electrode G. The ninth diffusion layer DL19 is an eighth portion PT2*d* of the transistor Tr1*d*. The eighth diffusion layer DL18 is a ninth portion PT1*d* of the transistor Tr1*d*. The ninth portion PT1*d* is the source of the transistor Tr1*d*. The eighth portion PT2*d* is the drain of the transistor Tr1*d*.

One contact CNT is installed in the fifth portion PT3 of the transistor Tr2. The contact CNT corresponds to the contact plug CP1 drawn in the +Z direction from each pillar 20 in FIG. 3. The transistor Tr3 is connected to the contact CNT. The second control circuit 25*f* can supply a voltage Vera to the bit line BL by applying the voltage Vera required for erasing data from the transistor Tr3 to the fifth portion PT3 of the transistor Tr2 via the contact CNT and appropriately controlling the voltage applied to the gate electrodes G. That is, the second control circuit 25*f* applies the voltage Vera to the fifth portion PT3 of the transistor Tr2 when a common voltage is applied to the first memory cell and the second memory cell. As a result, data of the memory cells MC constituting the same block is erased. The location at which the contact CNT is installed is preferably located in the vicinity of the center of the active region AA1 from a point of view of an influence of resistance to the interconnection (a point of view for not causing a great change in resistance value).

The first control circuit 25 needs to apply individual voltages to the memory cells MC corresponding to the first memory cell and the second memory cell when an operation of writing data or reading data is performed on the memory cells MC in the memory cell array MA. In this case, the first control circuit 25 individually controls the first transistor that is connected to the first memory cell in one-to-one correspondence (that is, the transistor Tr1*a*) and the second transistor that is connected to the second memory cell in one-to-one correspondence (that is, the transistor Tr1*b*). "Individually controlling" means that voltages to be individually applied to the memory cells MC are applied. For example, when data "1" is written to the first memory cell and data "0" is written to the second memory cell, the first control circuit 25 applies different individual voltages to the first memory cell and the second memory cell.

In the cell drive circuit 40*e* illustrated in FIG. 5, when the transistor Tr1*a* is defined as the first transistor and the transistor Tr1*b* is defined as the second transistor, the first transistor and the second transistor are arranged in a first direction, that is, in the X direction. When the transistor Tr2 is defined as the third transistor, the fifth portion of the third transistor (that is, the fifth portion PT3) lines up with the second portion of the first transistor (that is, the second portion PT1*a*) in the second direction (that is, the Y direction) crossing the first direction and lines up with the fourth portion of the second transistor (that is, the fourth portion PT1*b*) in the second direction. The first gate electrode G is an example of the first gate line that extends in the first direction (that is, the X direction) in which the first transistors and the second transistor are arranged and is commonly connected to the first transistor and the second transistor. The second gate electrode G is an example of the second gate line that lines up with the first gate line in the second direction (that is, the Y direction) crossing the first direction, extends in the first direction, and is connected to the third transistor.

In FIG. 5, the widths of the gate electrodes G are illustrated to have the same magnitude. However, at the time of performing the erasing operation, the voltage Vera can be applied thereto and the same high voltage can be applied to the gate electrode G for the erasing operation. In this case, the width of the gate electrode G for the erasing operation may be less than the width of the gate electrode G for the reading operation.

Figure 6:
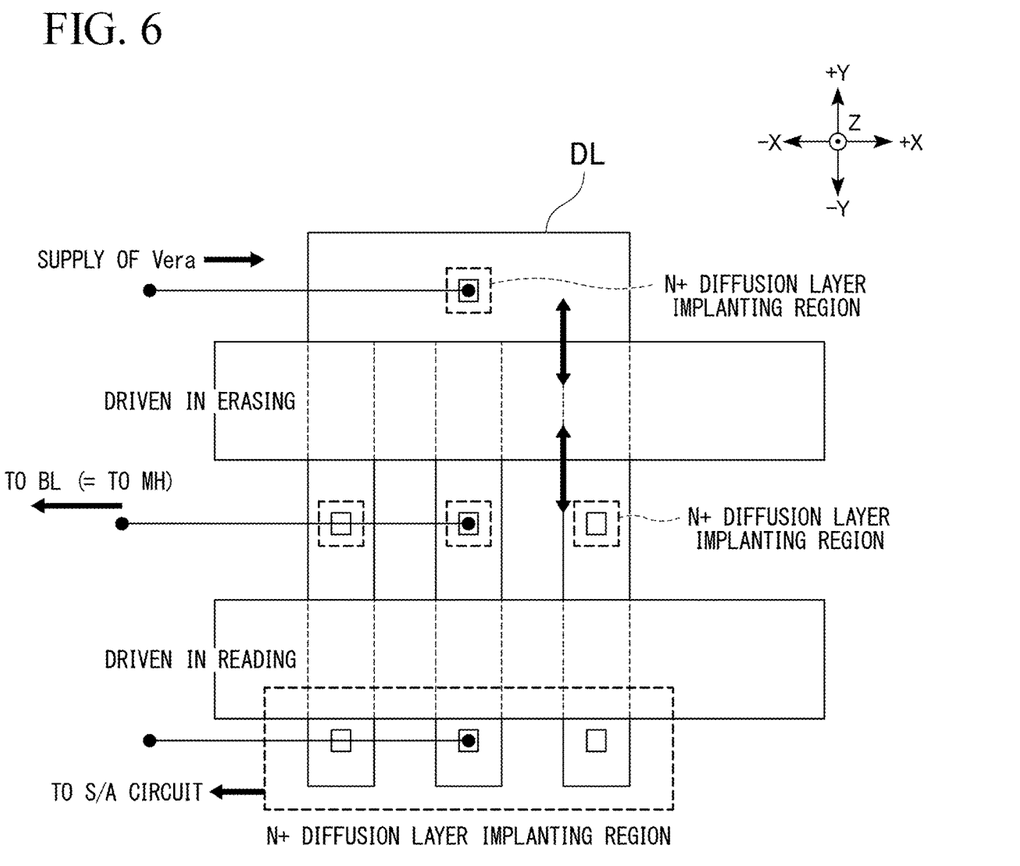
FIG. 6 is a diagram illustrating a first example of an impurity region of the semiconductor storage device according to the first embodiment.

For example, as illustrated in FIG. 6, for the contact CNT for supplying the voltage Vera and the contact CNT connected to the bit line BL, N+ impurities are implanted into only regions in which the contacts CNT are installed in the diffusion layer DL. "N+ impurities" represent a relative concentration in a region into which N-type impurities are implanted as impurities. The semiconductor storage device 10*e* is formed in a combination of an N+ region, an N region, an N− region, a P+ region, a P region, and a P− region. Accordingly, a contact CNT is formed in the region into which N+ impurities are implanted. On the other hand, a region into which N+ impurities are not implanted around the contact CNT is a region exhibiting a high resistance value. As a result, a resistance value between the contact CNT and the gate electrode does not decrease and a withstand voltage between the contact CNT and the gate electrode can be kept high. At the time of performing the reading operation, the first control circuit 25 (that is, the sense amplifier circuit) operates with a low voltage and does not require a high withstand voltage. Accordingly, the contact CNT may be formed by implanting N+ impurities into a peripheral region of the contact CNT including at least the contact CNT in a bundle. In this case, in comparison with a case in which the contact CNT is formed by limiting the region into which N+ impurities are implanted, the region into which N+ impurities are implanted is wider and thus the resistance value of the contact CNT decreases. However, when a high withstand voltage is not required such as when the similar high voltage is applied to the gate electrode G for the erasing operation at the same time as applying the voltage Vera at the time of performing the erasing operation, there is no problem with formation of the contact CNT by implanting N+ impurities in a bundle in this way. That is, by implanting N+ impurities into only the regions in which the contacts CNT are installed in the diffusion layers DL, the diffusion layers DL can be formed close to each other in the X direction as illustrated in FIG. 6. As a result, it is possible to further decrease the size of the semiconductor storage device 10*e*.

Figure 7:
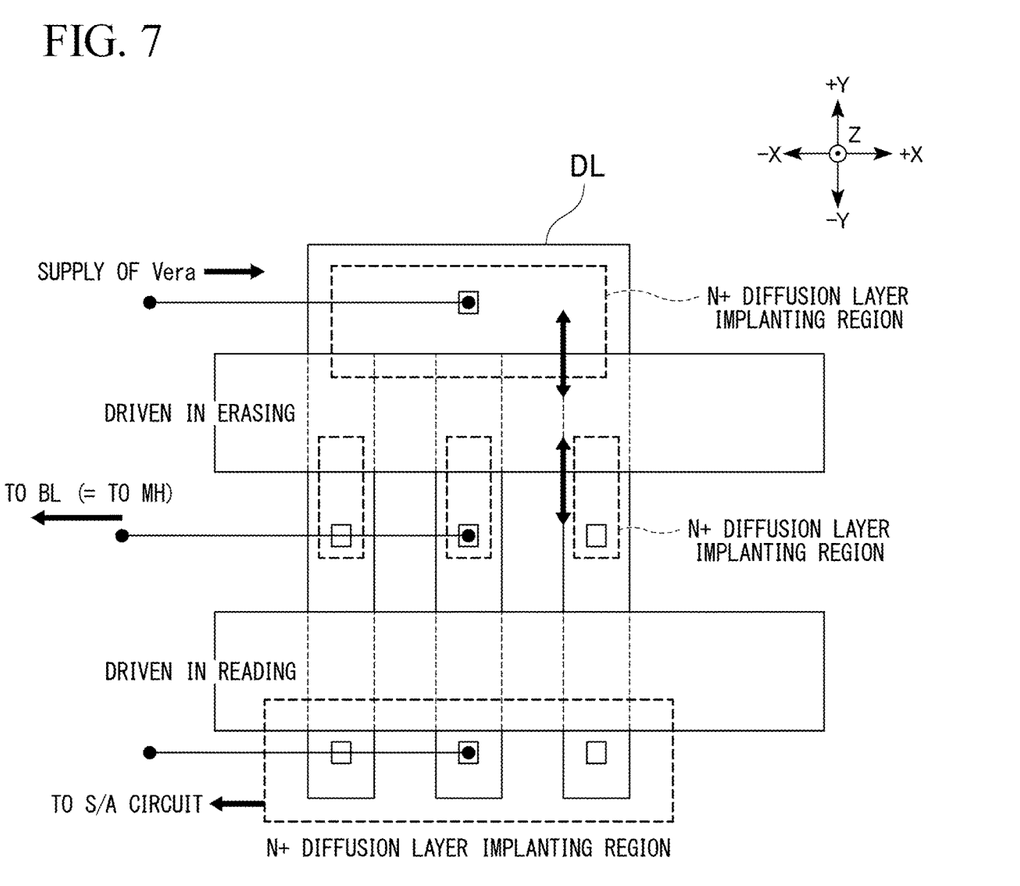
FIG. 7 is a diagram illustrating a second example of the impurity region of the semiconductor storage device according to the first embodiment.

When a high withstand voltage is not required such as when the similar high voltage is applied to the gate electrode G for the erasing operation at the same time as applying the voltage Vera at the time of performing the erasing operation, the region into which N+ impurities are implanted may be set to be wider than the region into which N+ impurities are implanted and which are illustrated in FIG. 6 unless the withstand voltage changes and the width of the gate electrode G for the erasing operation may be less than the width of the gate electrode G for the reading operation at the time of reading, for example, as illustrated in FIG. 7.

Figure 8:
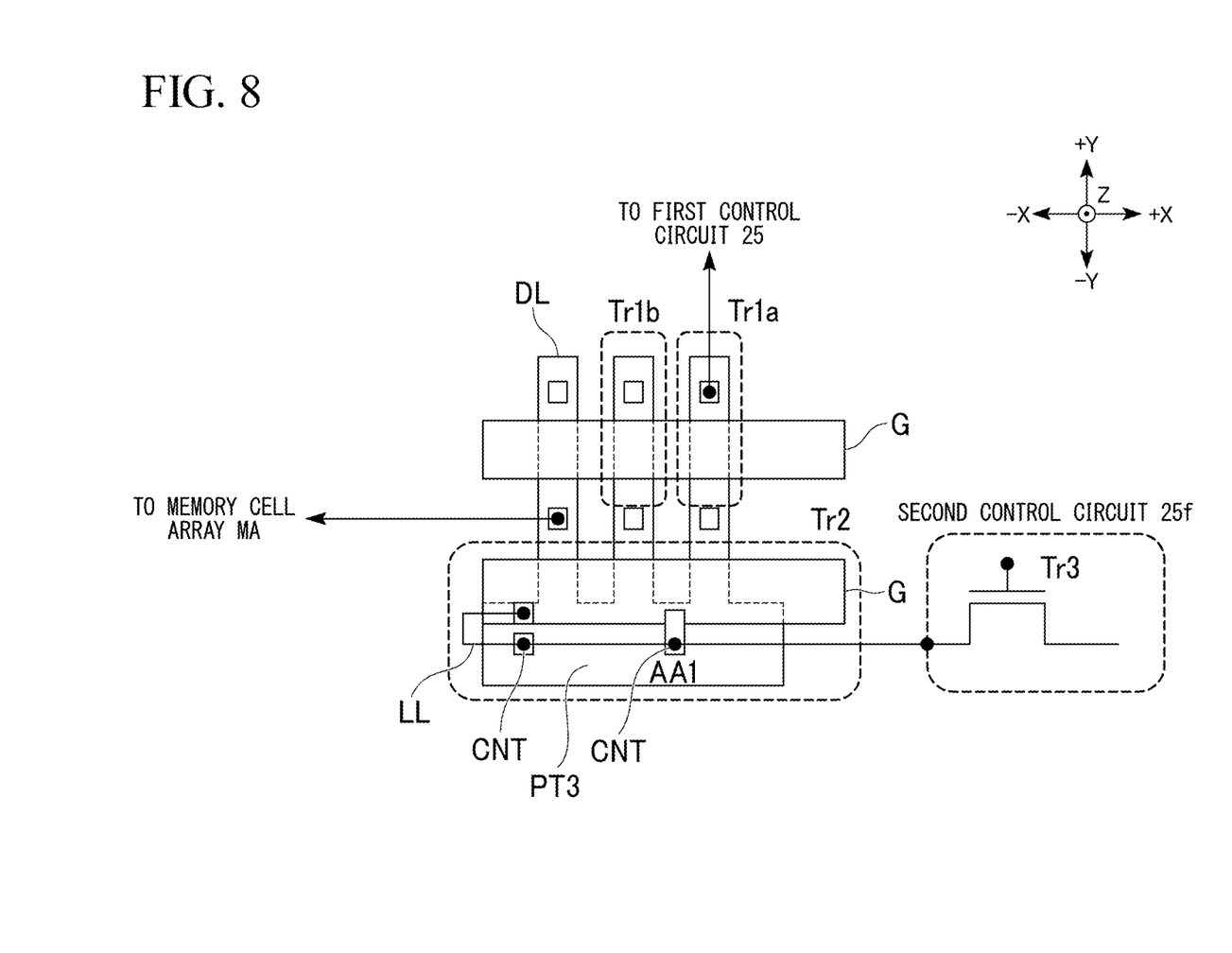
FIG. 8 is a diagram illustrating a layout of gate electrodes for an erasing operation according to the first embodiment.

When a high withstand voltage is not required such as when the similar high voltage is applied to the gate electrode G for the erasing operation at the same time as applying the voltage Vera at the time of performing the erasing operation, the fifth portion of the transistor Tr2 and the gate electrode G for the erasing operation may be connected to each other via a common contact CNT as illustrated in FIG. 8, or contacts may be installed in the fifth portion of the transistor Tr2 and the gate electrode G for the erasing operation and the contacts may be connected by a interconnection LL. The contact CNT connecting the fifth portion PT3 of the transistor Tr2 and the gate electrode G for the erasing operation is an example of a conductive portion connecting the fifth portion and the second circuit. The contacts for the connection which are installed in the fifth portion PT3 of the transistor Tr2 and the gate electrode G for the erasing operation using a interconnection is an example of the conductive portion connecting the third portion and the second circuit. The interconnection LL connecting the contacts is an example of a interconnection connecting the second gate line and the third portion. In this case, in comparison with a case in which the potential of the gate electrode G for the erasing operation is not set to the similar high potential as the voltage Vera, the potential difference between the voltages applied to the transistor Tr2 decreases and thus it is possible to decrease the withstand voltage of the transistor Tr2, that is, it is possible to decrease the size of the transistor Tr2.

Figure 9:
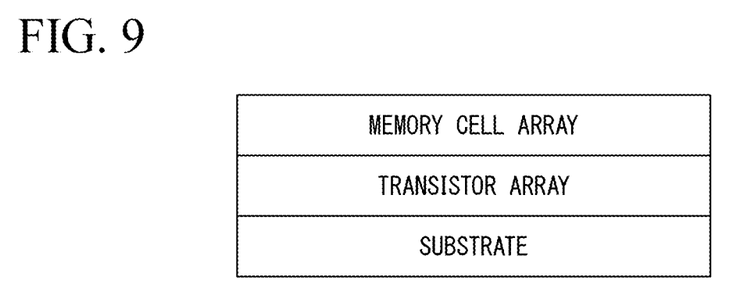
FIG. 9 is a first diagram illustrating a structure of the semiconductor storage device according to the first embodiment.
Figure 10:
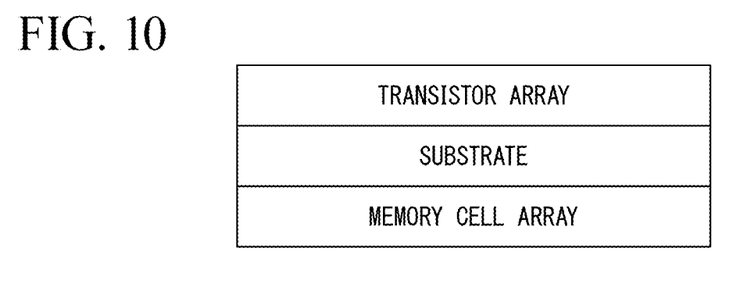
FIG. 10 is a second diagram illustrating a structure of the semiconductor storage device according to the first embodiment.

The semiconductor storage device 10e according to this embodiment is not limited to the structure illustrated in FIG. 3. For example, the semiconductor storage device 10e includes a substrate, a memory cell array, and a transistor array. The memory cell array includes a stacked body in which a conductive layer and an insulating layer are alternately stacked on the substrate and a plurality of pillars that extends in the stacked body in the thickness direction of the substrate. The first memory cell MC1 and the second memory cell MC2 are installed in parts in which the conductive layer and the plurality of pillars cross each other. The transistor array includes the first transistor, the second transistor, and the third transistor and is installed between the substrate and the memory cell array in the thickness direction of the substrate. That is, the semiconductor storage device 10e may have a structure in which the transistor array is installed between the memory cell array and the substrate as illustrated in FIG. 9. For example, the semiconductor storage device 10e includes a substrate, a memory cell array, and a transistor array. The memory cell array includes a stacked body in which a conductive layer and an insulating layer are alternately stacked on the substrate and a plurality of pillars that extends in the stacked body in the thickness direction of the substrate. The first memory cell MC1 and the second memory cell MC2 are installed in parts in which the conductive layer and the plurality of pillars cross each other. The transistor array includes the first transistor, the second transistor, and the third transistor and is installed on the opposite side of the substrate with respect to the memory cell array in the thickness direction of the substrate. That is, the semiconductor storage device 10e may have a structure in which the transistor array and the memory cell array are provided with the substrate interposed therebetween as illustrated in FIG. 10.

The semiconductor storage device 10e according to the first embodiment has been described above. In the semiconductor storage device 10e, the second portion PT1a of the transistor Tr1a is connected to the first memory cell MC1 in the memory cell array MA by the first line L1. The transistor Tr1b is a transistor connected to the first control circuit 25. The second portion PT1b of the transistor Tr1b is connected to the second memory cell MC2 in the memory cell array MA by the second line L2. The first control circuit 25 is individually connected to the first portion PT2a of the transistor Tr1a and the third portion PT2b of the transistor Tr1b. The second portion PT1c of the transistor Tr2 shares the second portion PT1a of the transistor Tr1a with the first transistor Tr1a. The fourth portion PT2c of the transistor Tr2 shares the second portion PT1b of the transistor Tr1b with the transistor Tr1b. The fifth portion of the transistor Tr2 can be commonly connected to the second portion PT1c of the transistor Tr2 and the fourth portion PT2c of the transistor Tr2. The transistor Tr3 is connected to the fifth portion of the transistor Tr2.

In the semiconductor storage device with this configuration, the fifth portion of the transistor Tr2 can be commonly connected to the second portion PT1c of the transistor Tr2 and the fourth portion PT2c of the transistor Tr2, for example, using one contact. That is, in the semiconductor storage device, it is possible to decrease the number of contacts CNT per pitch of a layout. As a result, it is possible to achieve a decrease in size of the semiconductor storage device.

In this embodiment, two transistors of the transistor Tr1a and the transistor Tr1b have been described above. However, the embodiment is not limited to the two transistors of the transistor Tr1a and the transistor Tr1b. In another embodiment, the structure described above in this embodiment may be applied to three or more transistors including a transistor Tr1c including the second portion PT1c and the third portion PT2c similarly to the transistor Tr1a and the transistor Tr1b.

Second Embodiment

In the first embodiment, the semiconductor storage device 10e has been described in conjunction with an example in which a batch process which is performed by the semiconductor storage device 10e is the erasing operation. However, the batch process which is performed by the semiconductor storage device 10e is not limited to the data erasing operation.

Figure 11:
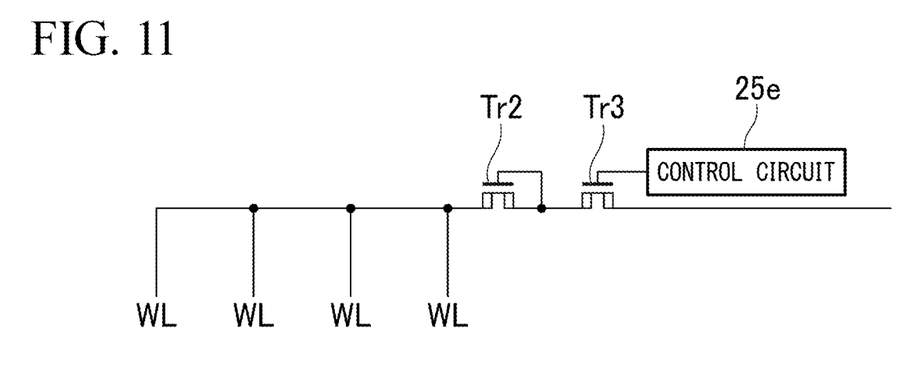
FIG. 11 is a diagram illustrating a configuration of a semiconductor storage device according to a second embodiment.

A semiconductor storage device 10e according to a second embodiment is a device that writes a program in a bundle. The semiconductor storage device 10e includes a control circuit 25e which is connected to a plurality of word lines WL, a transistor Tr2, and a transistor Tr3 as illustrated in FIG. 11 instead of the control circuit 25e which is connected to the plurality of bit lines BL, the transistor Tr2, and the transistor Tr3 as illustrated in FIG. 1. The other configuration of the semiconductor storage device 10e is the same as the semiconductor storage device 10e illustrated in FIG. 1. For example, the semiconductor storage device 10e stores data by applying the same voltage to a plurality of memory cells MC constituting a predetermined memory area in batches. Thereafter, data of the memory cells MC is individually rewritten.

The semiconductor storage device 10e according to the second embodiment has been described above. The semiconductor storage device 10e includes the control circuit 25e which is connected to a plurality of word lines WL, the transistor Tr2, and the transistor Tr3. In the semiconductor storage device with this configuration, it is possible to shorten a writing time in comparison with a case in which the memory cells MC are sequentially selected and a voltage is applied to the selected memory cell MC everytime.

While some embodiments and modification examples have been described above, embodiments are not limited thereto. The embodiments and the modification examples may be realized in combination. Some or all functions of the cell drive circuit 40e may be realized in hardware (which includes circuitry) such as an application-specific integrated circuit (ASIC), a programmable logic device (PLD), a field programmable gate array (FPGA). Ordinal numbers such as first and second in this specification are for convenience of description and may be renumbered.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising: a first memory cell;
    a second memory cell being different from the first memory cell;
    a first transistor including a first portion electrically connected to a first circuit, a second portion electrically connected to the first memory cell, and a first gate electrode installed between the first portion and the second portion;
    a second transistor including a third portion electrically connected to the first circuit, a fourth portion electrically connected to the second memory cell, and the first gate electrode installed between the third portion and the fourth portion; and
    a third transistor including the second portion, the fourth portion, a fifth portion electrically connected to a second circuit, and a second gate electrode installed between the second portion and the fifth portion and between the fourth portion and the fifth portion.

2. The semiconductor storage device according to claim 1, wherein the first transistor and the second transistor are arranged in a first direction, and the first transistor and the third transistor are arranged adjacent to each other in a second direction crossing the first direction.

3. The semiconductor storage device according to claim 1, wherein the first circuit individually controls the first transistor and the second transistor in a case where individual voltages are applied to the first memory cell and the second memory cell, and
    wherein the second circuit controls the third transistor in a case where a common voltage is applied to the first memory cell and the second memory cell.

4. The semiconductor storage device according to claim 1, wherein the second circuit applies a voltage to the fifth portion in a case where a common voltage is applied to the first memory cell and the second memory cell.

5. The semiconductor storage device according to claim 1, wherein the second circuit applies a voltage to the fifth portion in a case where the first memory cell and the second memory cell are caused to perform a common operation.

6. The semiconductor storage device according to claim 5, wherein the common operation is an erasing operation of erasing data stored in the first memory cell and the second memory cell.

7. The semiconductor storage device according to claim 1, wherein the first memory cell and the second portion are connected via a first interconnection, and
    wherein the second memory cell and the fourth portion are connected via a second interconnection.

8. The semiconductor storage device according to claim 7, comprising:
    a substrate;
    a stacked body in which a conductive layer and an insulating layer are alternately stacked on the substrate; and
    a plurality of pillars extending in the stacked body in a thickness direction of the substrate,
        wherein the first memory cell and the second memory cell are installed in crossed parts of the conductive layers and the plurality of pillars,
        wherein the first interconnection is connected to a first pillar included in the plurality of pillars, and
        wherein the second interconnection is connected to a second pillar different from the first pillar included in the plurality of pillars.

9. The semiconductor storage device according to claim 1, comprising:
    a conductive portion connecting the second circuit to the fifth portion,
        wherein the conductive portion is connected to the fifth portion and the second gate electrode.

10. The semiconductor storage device according to claim 9, comprising:
    a substrate;
    a stacked body in which a conductive layer and an insulating layer are alternately stacked on the substrate; and
    a plurality of pillars extending in the stacked body in a thickness direction of the substrate,
        wherein the first memory cell and the second memory cell are installed in crossed parts of the conductive layers and the plurality of pillars, and
        wherein the conductive portion is a pillar extending in the thickness direction of the substrate.

11. The semiconductor storage device according to claim 10,
    wherein the pillar extends to the fifth portion and the second gate electrode in the thickness direction of the substrate.

12. The semiconductor storage device according to claim 1, comprising:
    a first gate line extending in a first direction in which the first transistor and the second transistor are arranged and being commonly connected to the first transistor and the second transistor; and
    a second gate line lining up with the first gate line in a second direction crossing the first direction, extending in the first direction, and being connected to the third transistor,
        wherein a width of the second gate line in the second direction is less than a width of the first gate line in the second direction.

13. The semiconductor storage device according to claim 1, comprising:
- a first gate line extending in a first direction in which the first transistor and the second transistor are arranged and being commonly connected to the first transistor and the second transistor;
- a second gate line lining up with the first gate line in a second direction crossing the first direction, extending in the first direction, and being connected to the third transistor; and
- an interconnection connecting the third portion to the second gate line.

14. The semiconductor storage device according to claim 1, comprising:
- a substrate;
- a memory cell array; and
- a transistor array,
  - wherein the memory cell array including a stacked body in which a conductive layer and an insulating layer are alternately stacked on the substrate and a plurality of pillars extending in the stacked body in a thickness direction of the substrate, and the first memory cell and the second memory cell are installed in crossed parts of the conductive layers and the plurality of pillars, and
  - wherein the transistor array includes the first transistor, the second transistor, and the third transistor and is installed between the substrate and the memory cell array in the thickness direction of the substrate.

15. The semiconductor storage device according to claim 1, comprising:
- a substrate;
- a memory cell array; and
- a transistor array,
  - wherein the memory cell array including a stacked body in which a conductive layer and an insulating layer are alternately stacked on the substrate and a plurality of pillars extending in the stacked body in a thickness direction of the substrate, and the first memory cell and the second memory cell are installed in crossed parts of the conductive layers and the plurality of pillars, and
  - wherein the transistor array includes the first transistor, the second transistor, and the third transistor and is installed on an opposite side of the substrate with respect to the memory cell array in the thickness direction of the substrate.

* * * * *